United States Patent
Lee et al.

(10) Patent No.: US 9,111,991 B2
(45) Date of Patent: Aug. 18, 2015

(54) METHOD OF THIN SILICON DEPOSITION FOR ENHANCEMENT OF ON CURRENT AND SURFACE CHARACTERISTICS OF SEMICONDUCTOR DEVICE

(71) Applicant: SAMSUNG ELECTRONICS CO., LTD., Suwon-Si, Gyeonggi-Do (KR)

(72) Inventors: SangHyun Lee, Seoul (KR); Sungsam Lee, Gyeonggi-do (KR); Dongkak Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 17 days.

(21) Appl. No.: 14/049,435

(22) Filed: Oct. 9, 2013

(65) Prior Publication Data

US 2014/0120691 A1 May 1, 2014

(30) Foreign Application Priority Data

Oct. 25, 2012 (KR) ........................ 10-2012-0119108

(51) Int. Cl.
*H01L 21/76* (2006.01)
(52) U.S. Cl.
CPC ..................................... *H01L 21/76* (2013.01)
(58) Field of Classification Search
CPC ................ H01L 29/7827; H01L 21/28008; H01L 21/76

USPC ........................................ 438/400, 424, 283
See application file for complete search history.

(56) References Cited

U.S. PATENT DOCUMENTS

| | | | |
|---|---|---|---|
| 6,475,875 B1 | 11/2002 | Hau et al. | |
| 6,683,364 B2 | 1/2004 | Oh et al. | |
| 7,701,002 B2 * | 4/2010 | Seo et al. | 257/330 |
| 8,178,921 B2 | 5/2012 | Sheen et al. | |
| 2005/0085048 A1 | 4/2005 | Hsiao | |
| 2009/0101968 A1 | 4/2009 | Sugioka | |
| 2011/0006348 A1 * | 1/2011 | Cho et al. | 257/252 |
| 2012/0052664 A1 | 3/2012 | Fuse et al. | |
| 2012/0149172 A1 | 6/2012 | Huang et al. | |
| 2014/0061780 A1 * | 3/2014 | Son et al. | 257/330 |

FOREIGN PATENT DOCUMENTS

| | | |
|---|---|---|
| KR | 1020040078293 | 9/2004 |
| KR | 1020080010886 | 1/2008 |
| KR | 1020080061998 | 7/2008 |
| KR | 1020080084261 | 9/2008 |
| KR | 1020100074668 | 7/2010 |
| KR | 101067861 | 9/2011 |

* cited by examiner

*Primary Examiner* — Bradley K Smith
(74) *Attorney, Agent, or Firm* — F. Chau & Associates, LLC

(57) ABSTRACT

A method of fabricating a semiconductor device is provided. A fin portion protruding from a substrate is formed. A sacrificial layer is formed to cover top and side surfaces of the fin portion. A gate dielectric is formed on the fin portion by oxidizing the sacrificial layer.

10 Claims, 23 Drawing Sheets

US 9,111,991 B2

METHOD OF THIN SILICON DEPOSITION FOR ENHANCEMENT OF ON CURRENT AND SURFACE CHARACTERISTICS OF SEMICONDUCTOR DEVICE

CROSS-REFERENCE TO RELATED APPLICATION

This application claims priority under 35 U.S.C. §119 to Korean Patent Application No. 10-2012-0119108, filed on Oct. 25, 2012, in the Korean Intellectual Property Office, the disclosure of which is incorporated by reference herein in its entirety.

TECHNICAL FIELD

The present inventive concept relates to a semiconductor device and a method of fabricating the same, and more particularly, to a transistor having fin-shaped portions and methods of fabricating the same.

DISCUSSION OF RELATED ART

Semiconductor devices operating faster and consuming less power are in demand for electronic products. As semiconductor devices are ever decreasing in size, various gate structures of a transistor and fabrication methods thereof are being proposed to meet these demands.

SUMMARY

According to an exemplary embodiment of the present inventive concept, a method of fabricating a semiconductor device is provided. A device isolation layer is formed in a substrate to define a plurality of active regions. A trench is formed by patterning the plurality of active regions and the device isolation layer. The trench crosses the plurality of active regions and the device isolation layer disposed between two adjacent active regions. The trench has an uneven bottom surface. A sacrificial layer is formed on the uneven bottom surface of the trench. A gate dielectric is formed by oxidizing the sacrificial layer. The gate dielectric covers the uneven bottom surface of the trench. The uneven bottom surface of the trench is constituted by the patterned device isolation layer and the patterned active regions protruded from the patterned device isolation layer.

According to an exemplary embodiment of the present inventive concept, a method of fabricating a semiconductor device is provided. A fin portion protruding from a substrate is formed. A sacrificial layer is formed to cover top and side surfaces of the fin portion. A gate dielectric is formed on the fin portion by oxidizing the sacrificial layer.

According to an exemplary embodiment of the present inventive concept, a semiconductor device is provided. The semiconductor device includes a first trench isolation and a second trench isolation formed in a substrate. An active region includes a first portion and a second portion, when viewed in a first cross section. The first portion is disposed between the first and the second trench isolations. A second portion is protruded from the first portion and between the first and the second trench isolations. A gate dielectric is disposed on side and top surfaces of the second portion and is disposed on a top surface of the first trench isolation without filling the first and the second trenches. The top surface of the first trench isolation is level with a boundary between the first portion and the second portions. The first portion has substantially the same width as that of the second portion, wherein the width is measured at the boundary and between opposite side surfaces of the active region.

BRIEF DESCRIPTION OF THE DRAWINGS

These and other features of the inventive concept will become more apparent by describing in detail exemplary embodiments thereof with reference to the accompanying drawings of which:

FIGS. 3A through 7A are plan views illustrating a method of fabricating a semiconductor device according to an exemplary embodiment of the inventive concept;

FIGS. 3B through 7B are cross-sectional views taken along line I-I' of FIGS. 3A through 7A, respectively;

FIGS. 3C through 7C are cross-sectional views taken along line II-II' of FIGS. 3A through 7A, respectively;

FIGS. 9A through 13A are plan views illustrating a method of fabricating a semiconductor device according to an exemplary embodiment of the inventive concept;

FIGS. 9B through 13B are cross-sectional views taken along line I-I' of FIGS. 9A through 13A, respectively;

FIGS. 9C through 13C are cross-sectional views taken along line II-II' of FIGS. 9A through 13A, respectively;

DETAILED DESCRIPTION OF THE EMBODIMENTS

Figure 1:
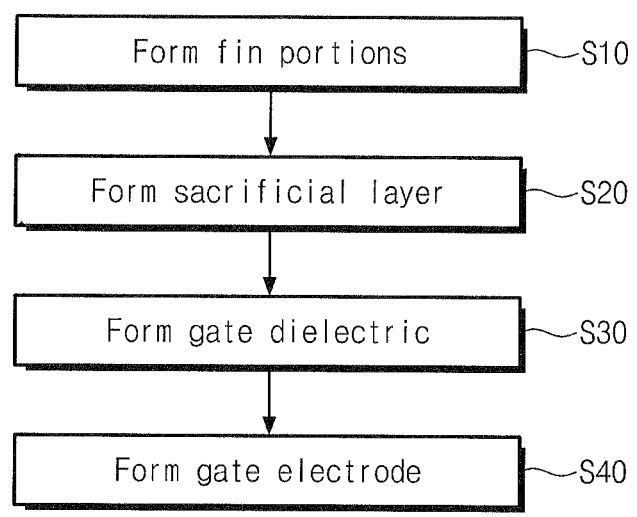
FIG. 1 is a flow chart of a method of fabricating a semiconductor device according to an exemplary embodiment of the inventive concept.

Exemplary embodiments of the inventive concept will hereafter be described with reference to the accompanying drawings. However, the inventive concept may be embodied in many different forms and should not be construed as limited to the embodiments set forth herein. It will be understood that when a layer is referred to as being "on" another layer or substrate, it may be directly on the other layer or substrate, or intervening layers may also be present. In the drawings, the thicknesses of layers and regions may be exaggerated for clarity. Like reference numerals may refer to the like elements throughout the specification and drawings.

It will be understood that when an element is referred to as being "connected" or "coupled" to another element, it may be directly connected or coupled to the other element or intervening elements may be present.

As used herein, the singular forms "a," "an" and "the" are intended to include the plural forms as well, unless the context clearly indicates otherwise.

FIG. 1 is a flow chart of a method of fabricating a semiconductor device according to an exemplary embodiment of the inventive concept. FIGS. 2A through 2D are perspective diagrams illustrating a method of fabricating a semiconductor device according to an exemplary embodiment of the inventive concept.

Figure 2A:
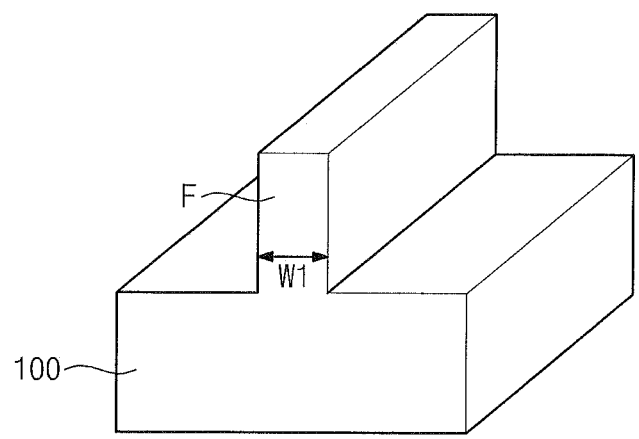
FIGS. 2A through 2D are perspective diagrams illustrating a method of fabricating a semiconductor device according to an exemplary embodiment of the inventive concept.

Referring to FIGS. 1 and 2A, a fin portion F may be formed on a substrate 100 to protrude from the substrate 100 (in step S10). The substrate 100 may include a semiconductor substrate (e.g., a silicon wafer, a germanium wafer, or a silicon-germanium wafer). The fin portion F may be formed to have a first width W1.

Figure 2B:
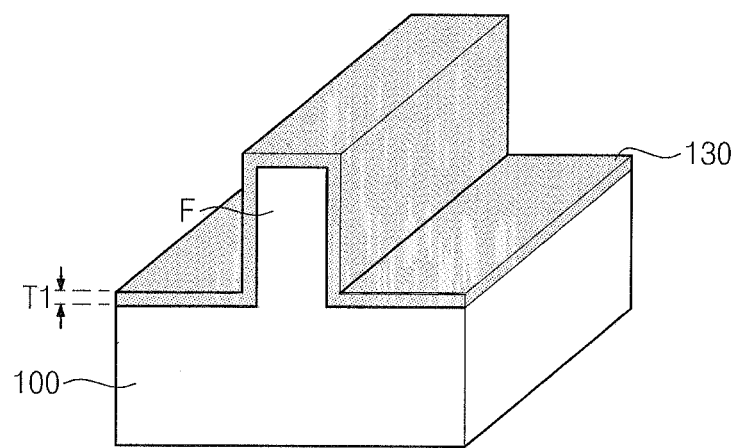

Referring to FIGS. 1 and 2B, a sacrificial layer 130 may be formed on the substrate 100 (in step S20). The sacrificial layer 130 may cover top and side surfaces of the fin portion F. The sacrificial layer 130 may include, for example, an amorphous silicon layer. For example, the amorphous silicon layer may be a silicon layer doped with boron (B) or arsenic (As) atoms or an undoped silicon layer. The sacrificial layer 130 may include one or more silicon layer. The sacrificial layer 130 may be formed to have a multilayered structure including a doped silicon layer and an undoped silicon layer. The sacrificial layer 130 may be formed using, for example, an atomic layer deposition (ALD) process. By using the ALD process, it is possible to control easily and precisely a thickness of the sacrificial layer 130. The sacrificial layer 130 may be formed to have a first thickness T1. For example, the first thickness T1 may range from about 1 Å to about 50 Å. In an exemplary embodiment, a thermal treatment process may be further performed on the sacrificial layer 130. As the result of the thermal treatment process, the amorphous silicon layer in the sacrificial layer 130 may be converted into a crystalline silicon layer.

Figure 2C:
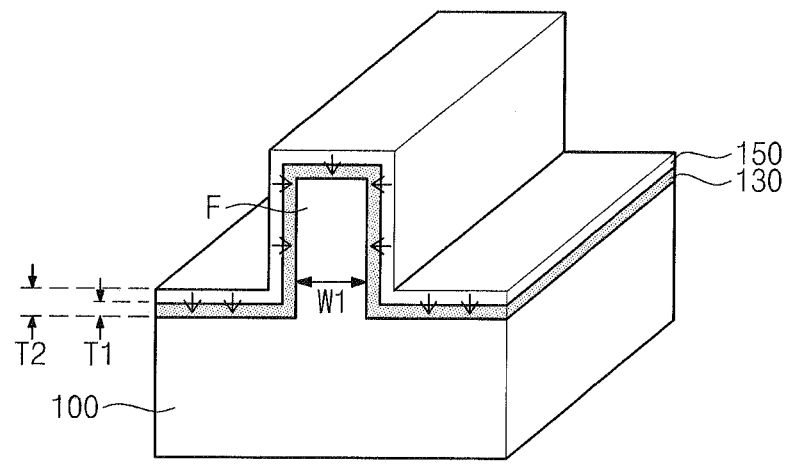

Referring to FIGS. 1 and 2C, a gate dielectric 150 may be formed on the substrate 100 (in step S30). For example, a cleaning process may be performed to the substrate 100 provided with the sacrificial layer 130. The cleaning process may be performed using, for example, HF and/or Standard Clean 1 (SC1). The cleaning process may be performed before the formation of the gate dielectric 150 to remove impurities from the substrate 100. Thereafter, the gate dielectric 150 may be formed using a thermal oxidation process, an ALD process, or a chemical vapor deposition (CVD) process. In an exemplary embodiment, the gate dielectric 150 may include a silicon oxide layer. In the case where the gate dielectric 150 is formed using an ALD or CVD process, the sacrificial layer 130 may be thermally oxidized. For example, during the formation of the gate dielectric 150, silicon atoms in the sacrificial layer 130 may be reacted with oxygen atoms to form a silicon oxide layer constituting a portion of the gate dielectric 150. In the case where the gate dielectric 150 is formed by the thermal oxidation process, the sacrificial layer 130 may be oxidized to form the gate dielectric 150. The gate dielectric 150 may be formed to have a second thickness T2 that is greater than the first thickness T1 of the sacrificial layer 130. After the oxidation of the sacrificial layer 130, the fin portions F may have substantially the same width W1 as that before the formation of the gate dielectric 150.

In the case where the gate dielectric 150 is directly formed on the substrate 100 provided with the fin portion F or on the structure of FIG. 2A, a portion of the fin portion F may be oxidized during the formation of the gate dielectric 150. Accordingly, the fin portion F may have a width that is smaller than the width (e.g., W1) before the formation of the gate dielectric 150. By contrast, according to an exemplary embodiment of the inventive concept, the gate dielectric 150 may be formed on the substrate 100 provided with the sacrificial layer 130, and thus, the sacrificial layer 130 may serve to prevent the fin portion F from being oxidized during the formation of the gate dielectric 150. Accordingly, the fin portion F may have substantially the same width (e.g., W1), before and after the formation of the gate dielectric 150. Compared with the case that the gate dielectric 150 is directly formed on the substrate 100 provided with the fin portion F, the fin portion F may have a relatively large width and may increase a channel width. The large channel width may result in a reduction in electric resistance of a channel region, such that the semiconductor device may have an increased cell current. Further, since the fin portion F is prevented from being oxidized, surfaces of the fin portions F may be maintained to be in the initial patterned state, and thus, a gate-induced drain leakage (GIDL) and a junction leakage may be suppressed or reduced.

Figure 2D:
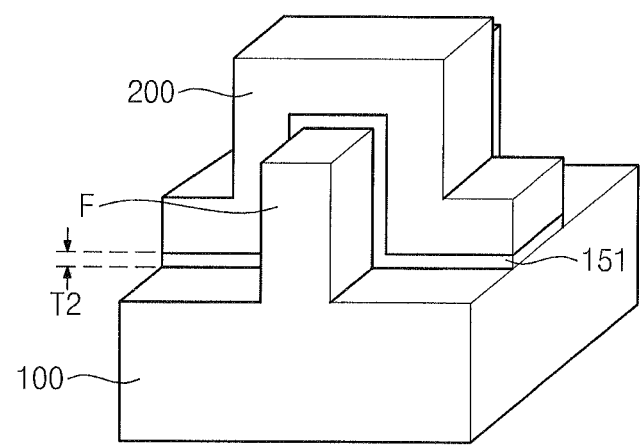

Referring to FIGS. 1 and 2D, a gate electrode 200 may be formed on the substrate 100 (in step S40). The gate electrode 200 may be formed to cross the fin portion F. For example, a conductive layer may be formed on the substrate 100 provided with the gate dielectric 150. The conductive layer may be formed using, for example, a CVD process. The conductive layer may include a conductive material. The conductive material may include, for example, doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), or metal-semiconductor compounds (e.g., tungsten silicide, cobalt silicide, titanium silicide, and so forth). The gate electrode 200 may be formed by etching the conductive layer. An exposed portion of the gate dielectric 150, which is not covered with the gate electrode 200, may be formed during the etching of the conductive layer. Accordingly, a gate dielectric pattern 151 may be formed to be interposed between the gate electrode 200 and a portion of the fin portion F.

FIGS. 3A through 7A are plan views illustrating a method of fabricating a semiconductor device according to an exemplary embodiment of the inventive concept. FIGS. 3B through 7B are cross-sectional views taken along line I-I' of FIGS. 3A through 7A, respectively, and FIGS. 3C through 7C are cross-sectional views taken along line II-IF of FIGS. 3A through 7A, respectively.

Figure 3A:
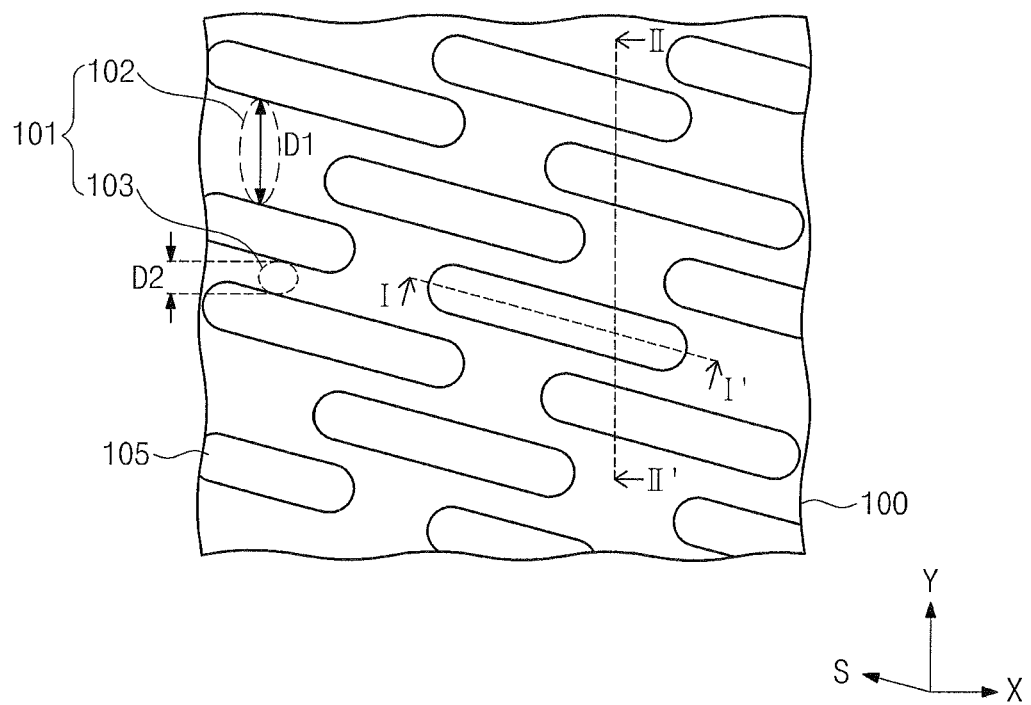
Figure 3B:
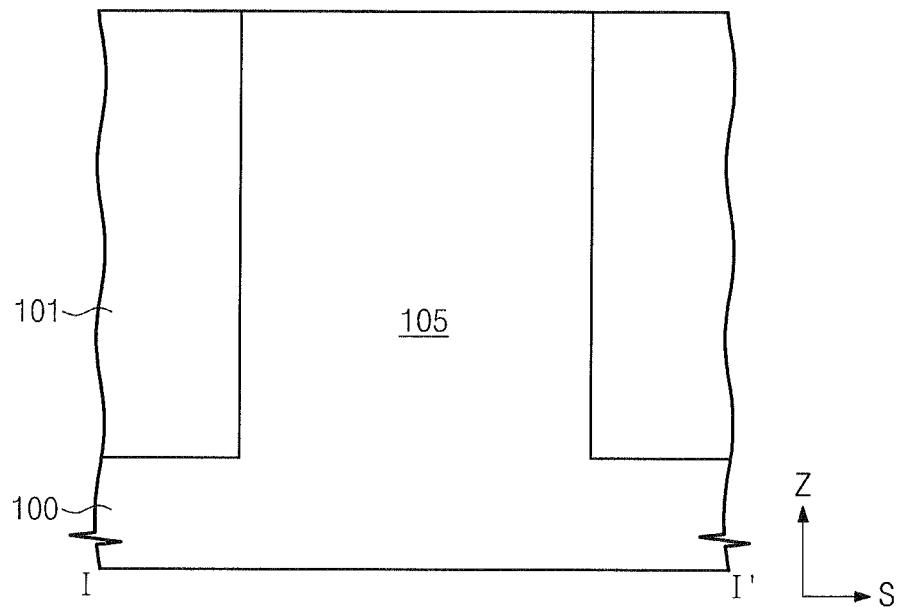
Figure 3C:
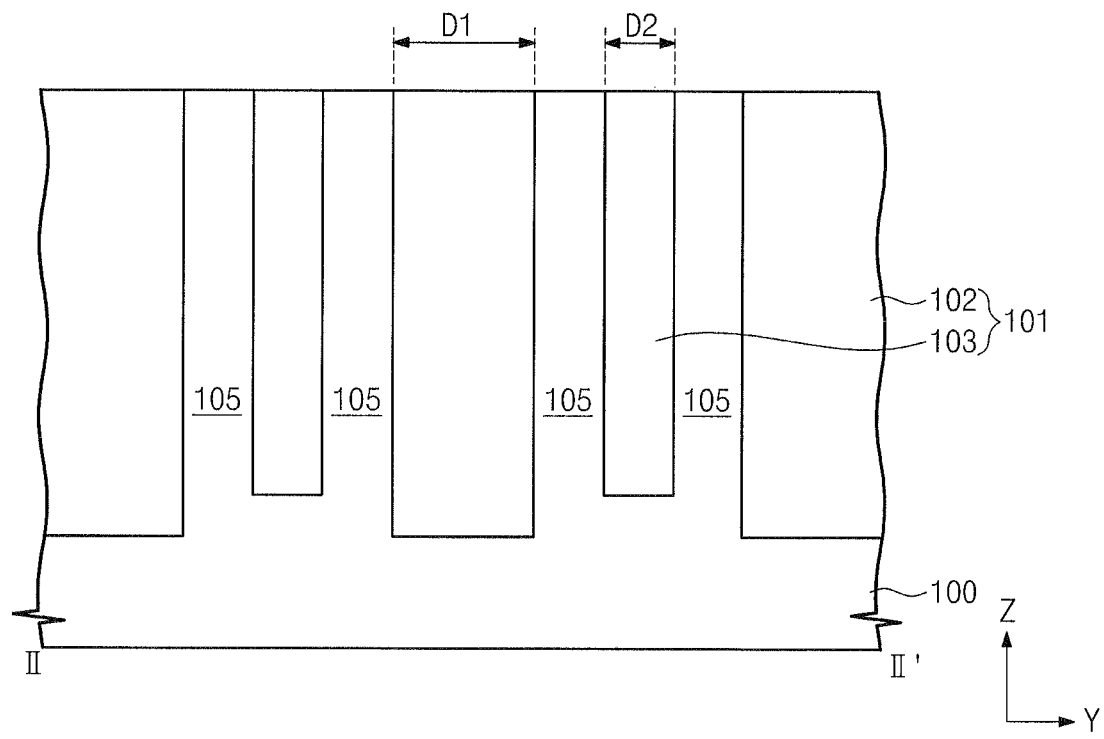

Referring to FIGS. 3A through 3C, a device isolation layer 101 may be formed on a substrate 100 to define active regions 105. The substrate 100 may include a semiconductor substrate (e.g., a silicon wafer, a germanium wafer, or a silicon-germanium wafer). Each of the active regions 105 may be shaped like a bar when viewed from a plan view and may be extended in parallel to a third direction (or S direction) at an angle to both of a first direction (or X direction) and a second direction (or Y direction). Here, the first and second directions may cross each other. The active regions 105 may include an impurity injection region doped with N-type or P-type impurities. A fourth direction (or Z direction) may be a direction orthogonal to all of the first to third directions. Here, FIGS. 3B and 3C show Z-S and Z-Y sections of the device, respectively. The device isolation layer 101 may be formed using, for example, a shallow trench isolation (STI) technique. The device isolation layer 101 may include a silicon nitride layer, a silicon oxide layer, and/or a silicon oxynitride layer. The device isolation layer 101 may include a first region 102 and a second region 103. A distance d1 between the active regions 105 adjacent to the first region 102 may be greater than a distance d2 between the active regions 105 adjacent to the second region 103. The distances d1 and d2 between the active regions 105 may be measured along the second direction Y. In an exemplary embodiment, since the distance d1 is greater than the distance d2, the device isolation layer 101 of the first region 102 may be formed to extend into the substrate 100 deeper than the device isolation layer 101 of the second region 103. Alternatively, the device isolation layers 101 of the first and second regions 102 and 103 may be formed to have substantially the same depth.

Figure 4A:
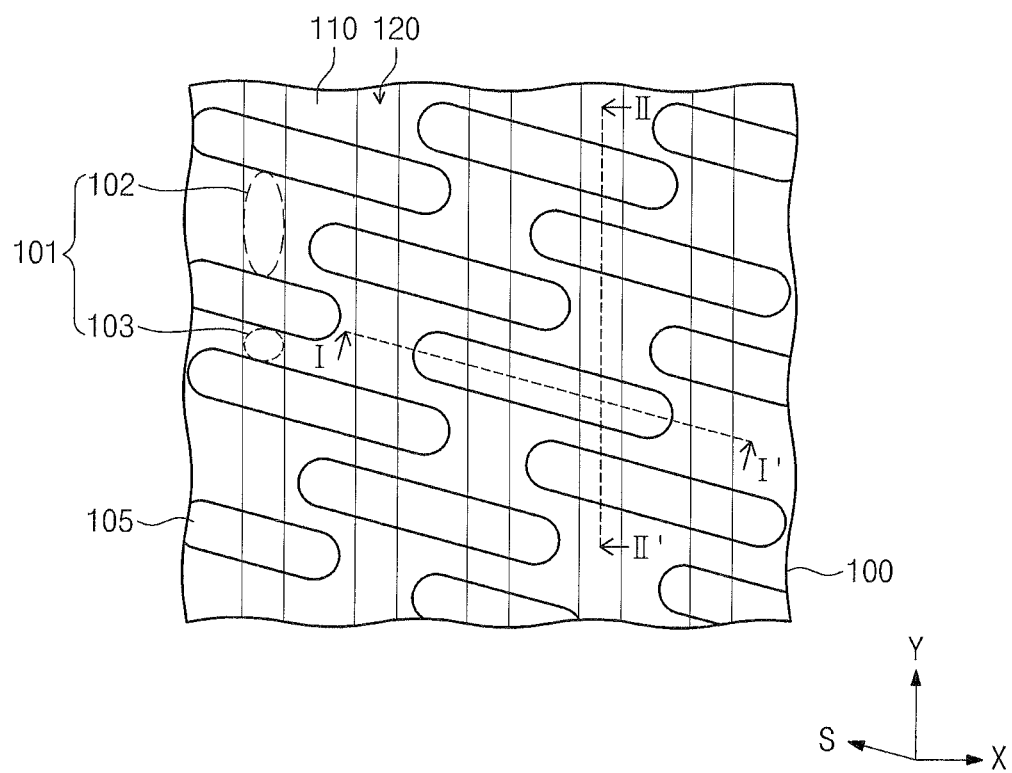
Figure 4B:
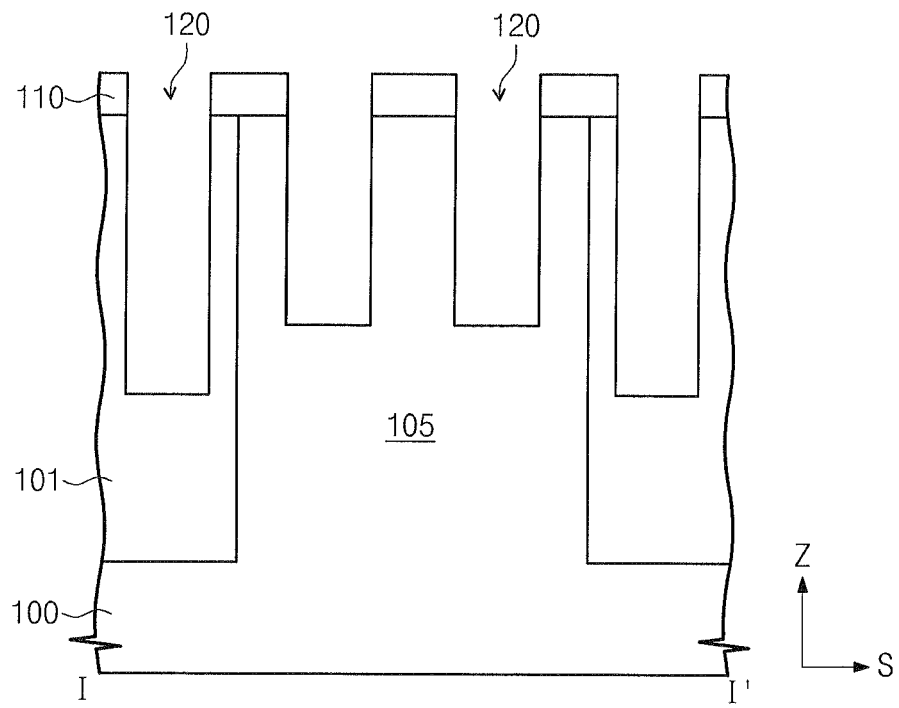
Figure 4C:
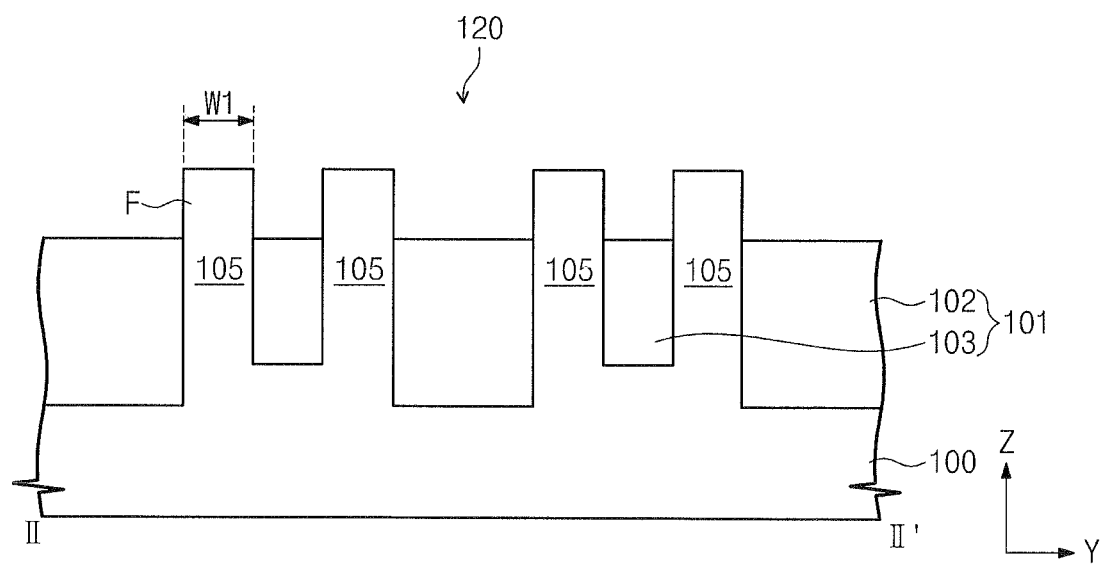
Figure 5A:
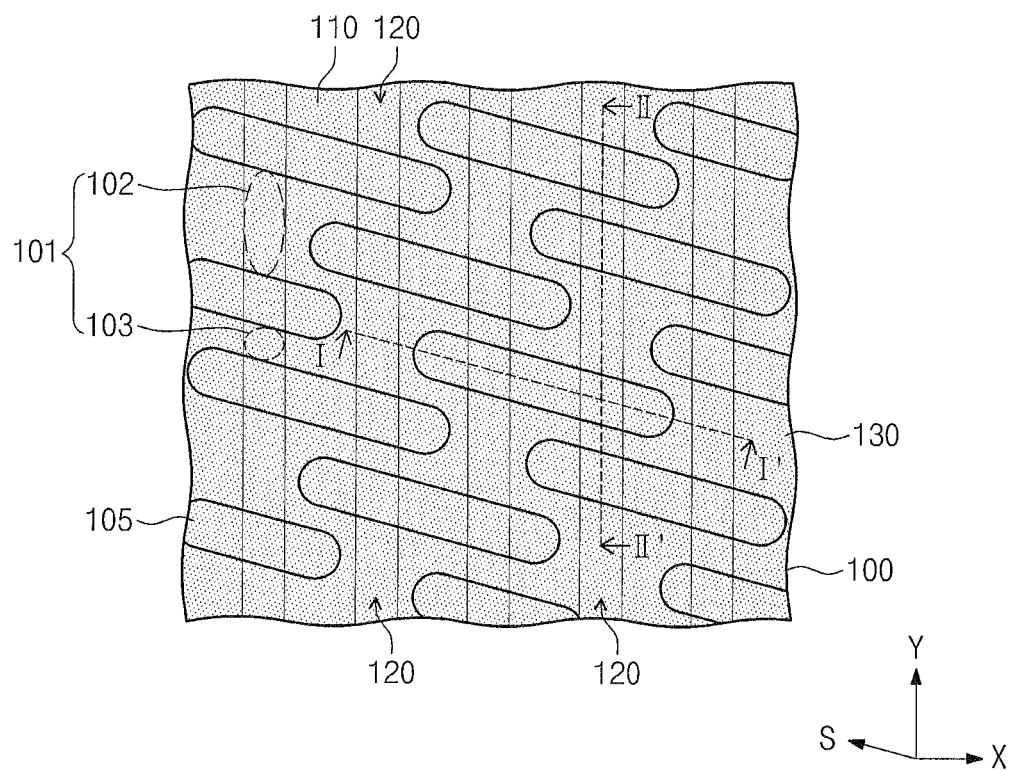
Figure 5B:
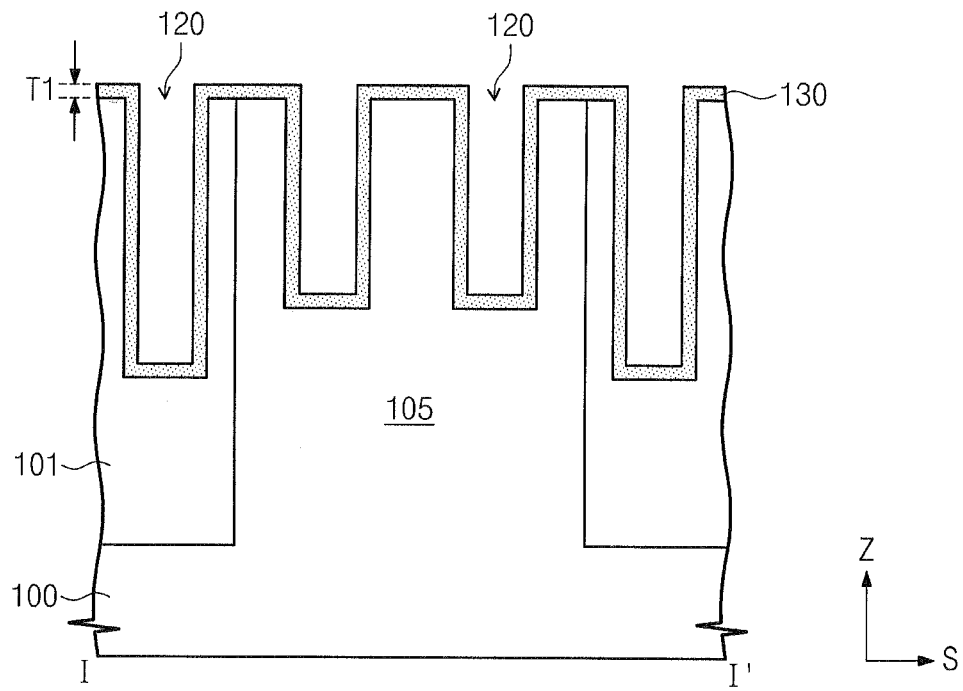
Figure 5C:
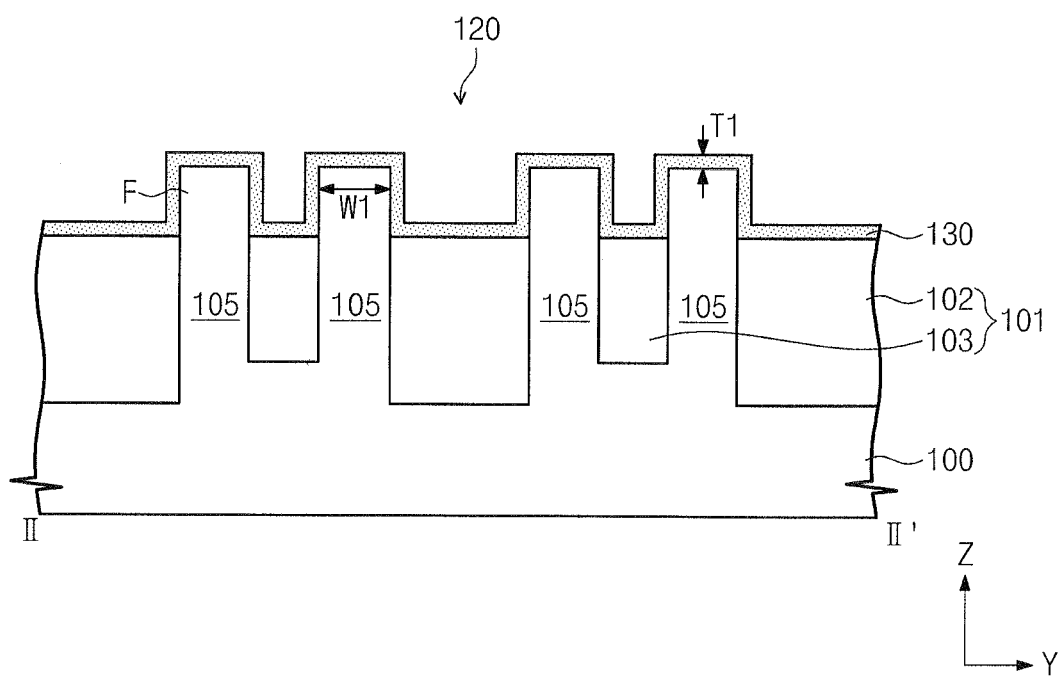

Referring to FIGS. 1, and 4A through 4C, fin portions F may be formed to protrude from the substrate 100 (in step S10). For example, mask patterns 110 may be formed on the substrate 100. The mask patterns 110 may be formed to have openings defining regions in which gate electrodes will be provided. The mask patterns 110 may be a hard mask pattern (e.g., silicon nitride) or a photoresist pattern. The substrate 100 and the device isolation layer 101 may be etched using the mask patterns 110 as an etch mask to form line-shaped trenches 120 extending along the second direction Y. The device isolation layer 101 and the active region 105 may be etched at different etch rates, and thus the device isolation layer 101 may be etched deeper than the active region 105. For example, upper regions of the active region 105 (hereinafter, referred as to "fin portions F"), as shown in FIG. 4C, may protrude from the substrate 100, as the result of the etching process. The fin portions F may be formed to have a first width W1.

Referring to FIGS. 1, and 5A through 5C, a sacrificial layer 130 may be formed on the substrate 100 to cover the fin portions F (in step S20). Firstly, the mask patterns 110 shown in FIGS. 4A through 4C may be removed. In the case where a photoresist pattern is used for the mask patterns 110, the mask patterns 110 may be removed by an ashing process. In the case where a hard mask pattern (e.g., a silicon nitride layer) is used for the mask patterns 110, the mask patterns 110 may be removed by a cleaning process using phosphoric acid. Next, the sacrificial layer 130 may be formed on the substrate 100 provided with the trenches 120. The sacrificial layer 130 may be formed to cover top and side surfaces of the fin portions F. The sacrificial layer 130 may include, for example, an amorphous silicon layer. The amorphous silicon layer may include a silicon layer doped with boron (B) or arsenic (As) atoms or an undoped silicon layer. In an exemplary embodiment, the sacrificial layer 130 may include one or more silicon layers. For example, the sacrificial layer 130 may be formed to have a multilayered structure including a doped silicon layer and an undoped silicon layer. The sacrificial layer 130 may be formed using, for example, an atomic layer deposition (ALD) process. By using an ALD process, it is possible to control easily and precisely a thickness of the sacrificial layer 130. The sacrificial layer 130 may be formed to have a first thickness T1. For example, the first thickness T1 may range from about 1 Å to about 50 Å. In an exemplary embodiment, a thermal treatment process may be further performed on the sacrificial layer 130. As the result of the thermal treatment process, the amorphous silicon layer in the sacrificial layer 130 may be converted into a crystalline silicon layer.

Referring to FIGS. 1, and 6A through 6C, a gate dielectric 150 may be formed on the substrate 100 (in step S30). First, a cleaning process may be performed on the substrate 100 provided with the sacrificial layer 130 or on the resulting structure shown in FIGS. 5A through 5C. The cleaning process may be performed using, for example, HF and/or SC1. The cleaning process may be performed before the formation of the gate dielectric 150 to remove impurities from the substrate 100. Thereafter, the gate dielectric 150 may be formed using a thermal oxidation process, an ALD process, or a CVD process. In an exemplary embodiment, the gate dielectric 150 may include a silicon oxide layer. As described with reference to FIGS. 2A through 2D, during the formation of the gate dielectric 150, silicon atoms in the sacrificial layer 130 may be reacted with oxygen atoms to form a silicon oxide layer constituting a portion of the gate dielectric 150. The gate dielectric 150 may be formed to have a second thickness T2 greater than the first thickness T1 of the sacrificial layer 130. In addition, as the result of the oxidation of the sacrificial layer 130, the width W1 of the fin portions F may be maintained to be the same as that before the formation of the gate dielectric 150.

Figure 7A:
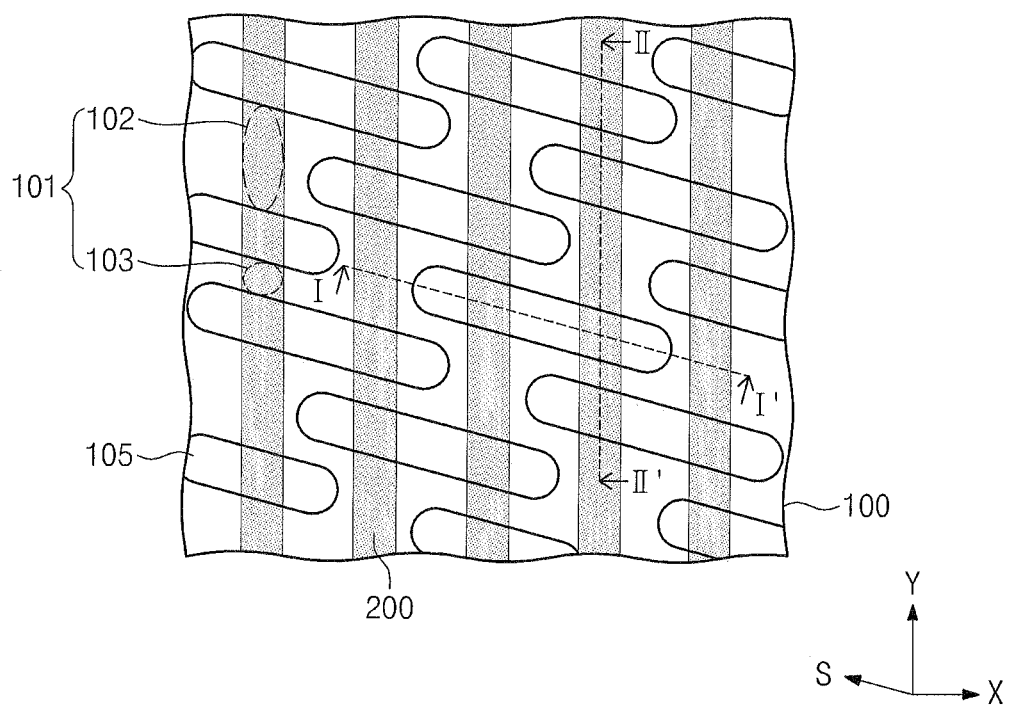
Figure 7B:
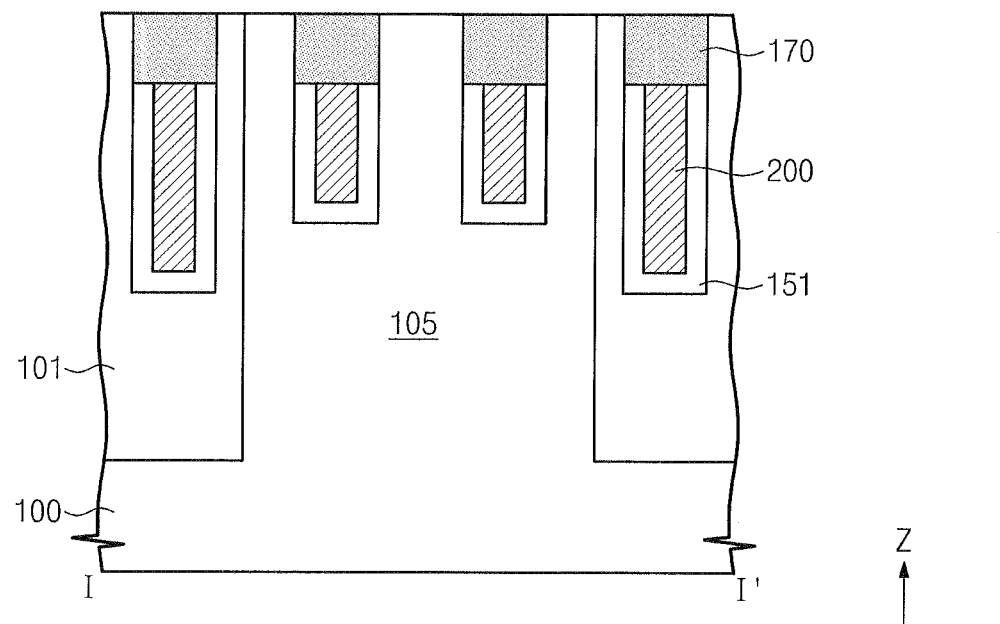
Figure 7C:
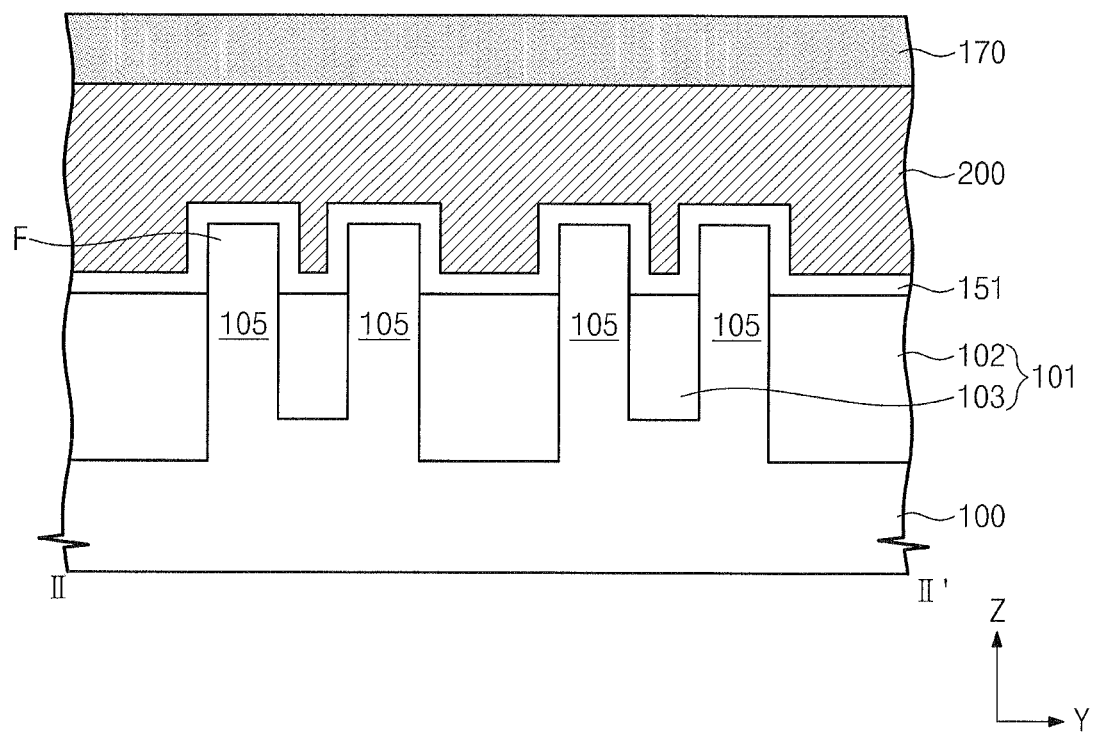

Referring to FIGS. 1, and 7A through 7C, gate electrodes 200 may be formed on the substrate 100 provided with the gate dielectric 150 (in step S40). In the plan view of FIG. 7A, the gate electrodes 200 may be formed to cross the active regions 105. For example, the gate electrodes 200 may be spaced apart from each other along the first direction X and extend lengthwise in the second direction Y. The gate electrodes 200 may be buried in the substrate 100 to have a buried gate structure. For example, the formation of the gate electrodes 200 may include forming a conductive layer on the substrate 100 provided with the gate dielectric 150. The conductive layer may be formed using a CVD process. The conductive layer may include a conductive material. For example, the conductive material may include doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), or metal-semiconductor compounds (e.g., tungsten silicide, cobalt silicide, titanium silicide, and so forth). The gate electrodes 200 may be formed by etching the conductive layer. After the etching process is performed, the conductive layer may be removed except in the trenches 120, and the gate electrodes 200 may be formed in the trenches 120 having a predetermined thickness. The gate dielectric 150 which is not covered with the gate electrode 200 may be removed during the etching process. Accordingly, gate dielectric patterns 151 may be formed to be interposed between the gate electrodes 200 and the active regions 105 and/or between the gate electrodes 200 and the device isolation layer 101. Thereafter, a capping layer may be formed on the substrate 100, and a planarization process may be performed to form capping patterns 170 in the trenches 120. The capping patterns 170 may include a silicon nitride layer, a silicon oxide layer, or a silicon oxynitride layer. The capping patterns 170 may have a top surface that is coplanar with an upper surface of the active regions 105 in the Z-S section of the semiconductor device as shown in FIG. 7B.

According to an exemplary embodiment of the inventive concept, as described with reference to FIGS. 2A through 2D, the gate dielectric 150 may be formed on the substrate 100 provided with the sacrificial layer 130, and thus, it is possible to prevent the fin portions F from being oxidized during the formation of the gate dielectric 150. Accordingly, the fin portions F may have the same width (e.g., W1), before and after the formation of the gate dielectric 150. For example, because the sacrificial layer 130 is oxidized without consuming silicon in the fin portions F, the fin portions F may have substantially the same width after the formation of the gate electrode 200. The channel width may be increased without increasing the fin portions F in size compared to the case where the sacrificial layer 130 is not used. The large channel width may result in a reduction in electric resistance of a channel region, such that the semiconductor device may have an increased cell current. Further, since the fin portions F are prevented from being oxidized, surfaces of the fin portions F may be maintained to be in the initial patterned state, and thus, a gate-induced drain leakage (GIDL) and a junction leakage may be suppressed or reduced.

Figure 8A:
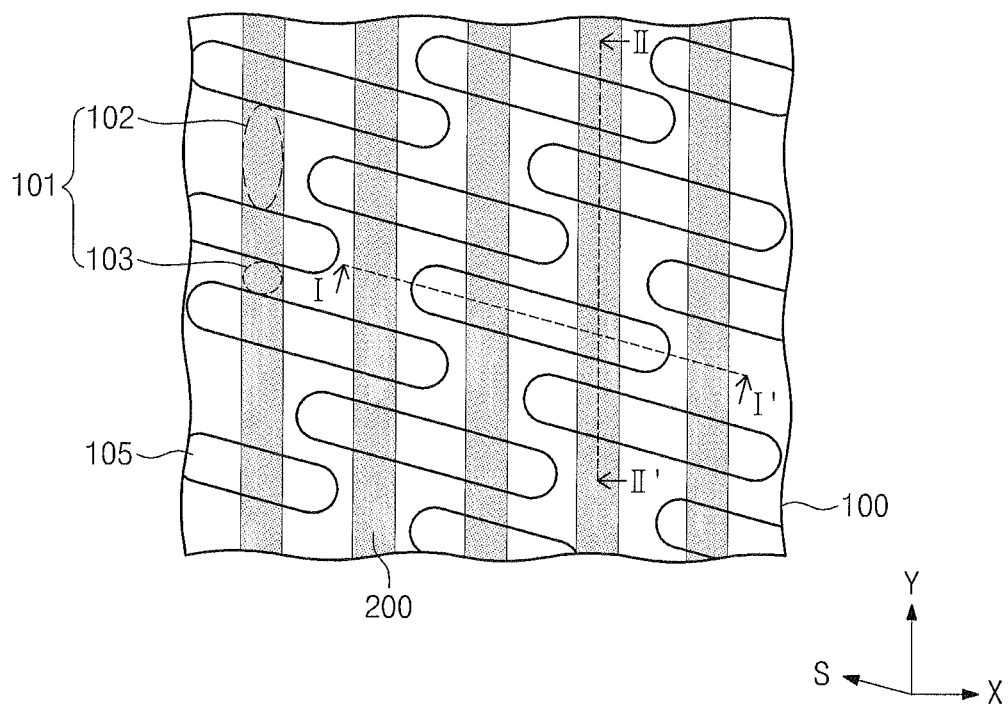
FIG. 8A is a plan view illustrating a method of fabricating a semiconductor device according to an exemplary embodiment of the inventive concept.
Figure 8B:
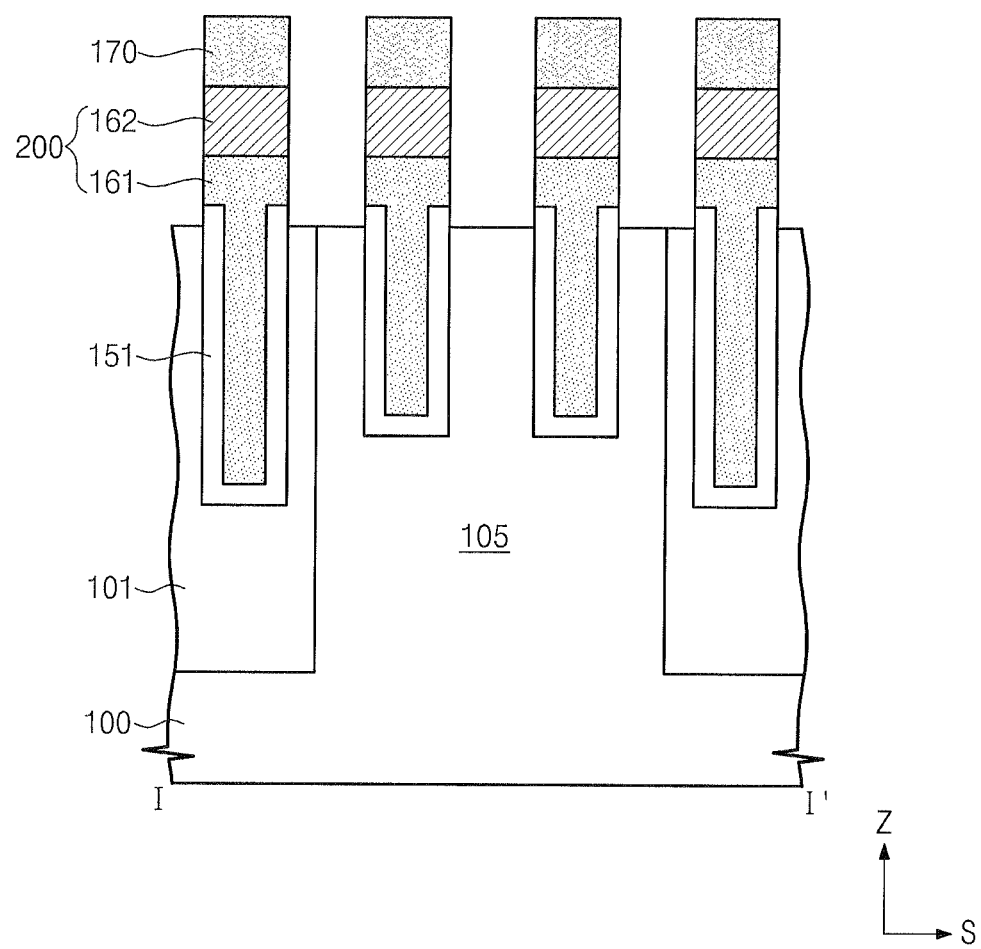
FIGS. 8B and 8C are cross-sectional views taken along lines I-I' and II-IF, respectively, of FIG. 8A.
Figure 8C:
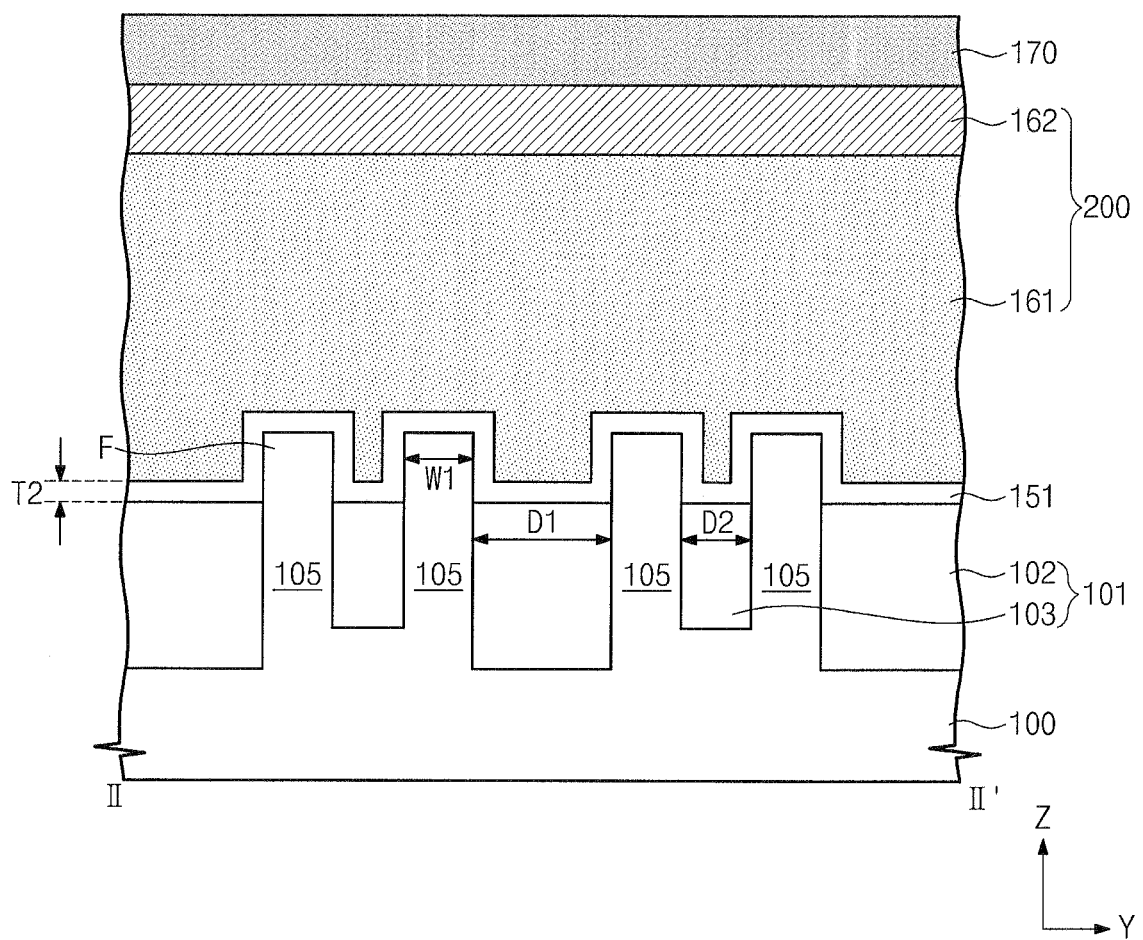

FIG. 8A is a plan view illustrating a method of fabricating a semiconductor device according to an exemplary embodiment of the inventive concept, and FIGS. 8B and 8C are cross-sectional views taken along lines I-I' and II-II' respectively, of FIG. 8A. An element previously described with reference to FIGS. 1 and 3A through 7C identified by a similar or identical reference number might not have its description repeated.

Figure 6A:
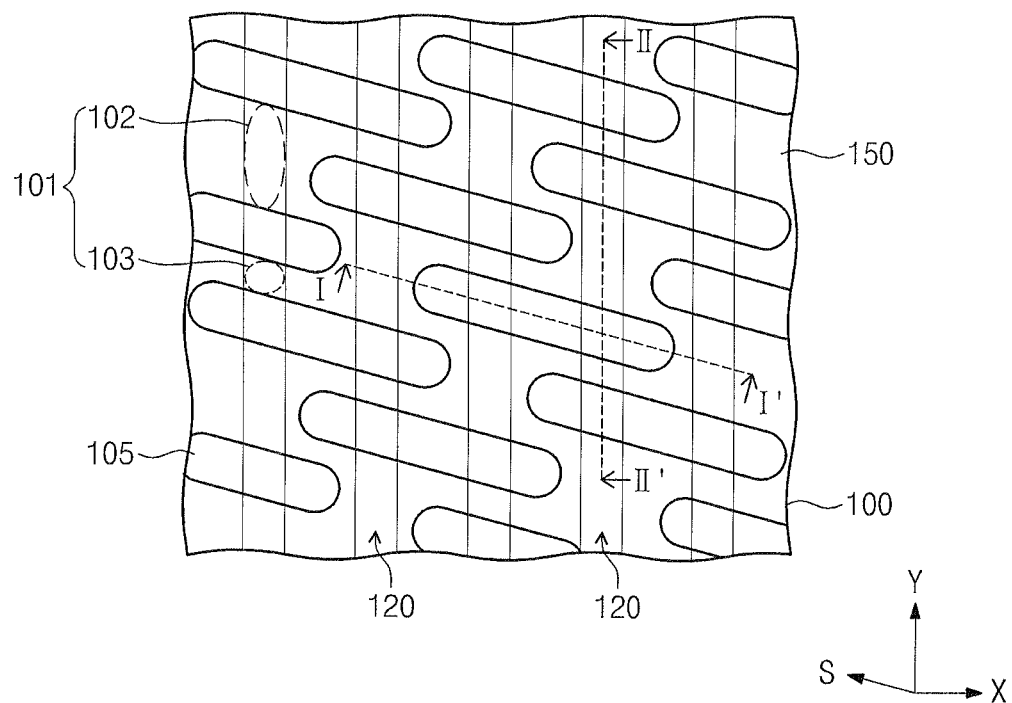
Figure 6B:
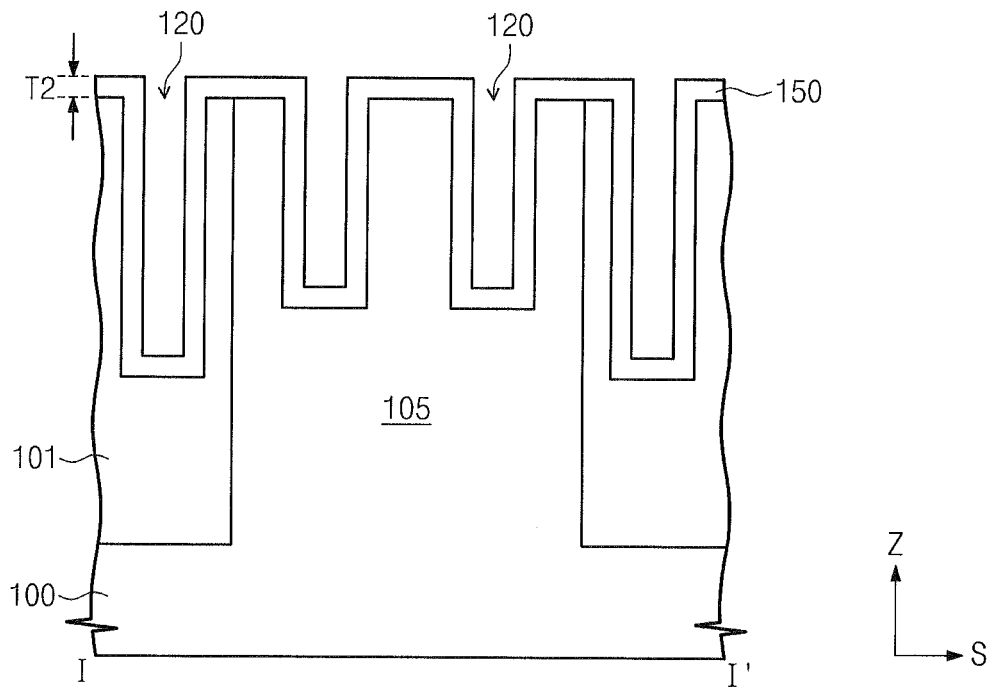
Figure 6C:
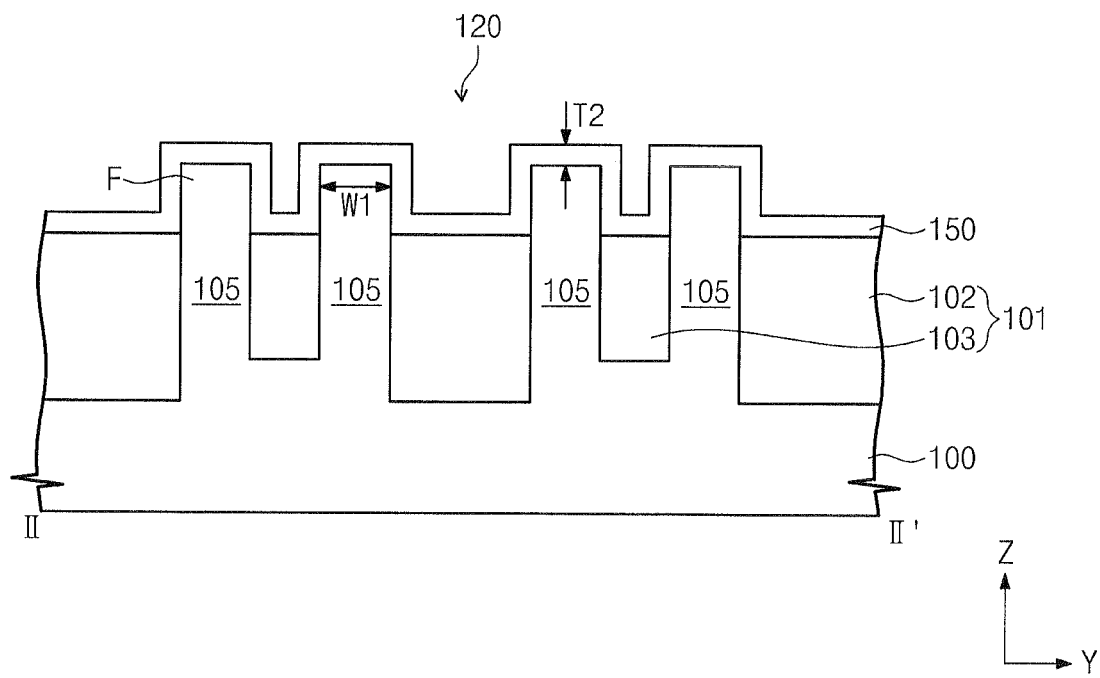

Referring to FIGS. 1 and 8A through 8C, gate electrodes 200 may be formed on the structure described with reference to FIGS. 6A through 6C (in step S40). In the plan view of FIG. 8A, the gate electrodes 200 may be formed to cross the active regions 105. The gate electrodes 200 may be spaced apart from each other along the first direction X and extend in the second direction Y. Each of the gate electrodes 200 may be a recess gate electrode including a portion protruding upward from the substrate 100 and other portion extending into the substrate 100. The formation of the gate electrodes 200 may include sequentially stacking a first conductive layer, a second conductive layer, and a capping layer on the substrate 100 provided with the gate dielectric (e.g., 150 of FIGS. 6A through 6C). A portion of the first conductive layer may fill the trenches (e.g., 120 of FIGS. 6A through 6C). In an exemplary embodiment, the first conductive layer may include a polysilicon layer, and the second conductive layer may include a metal silicide layer. The capping layer may include a silicon nitride layer, a silicon oxide layer, or a silicon oxynitride layer. Thereafter, the capping layer, the second conductive layer, and the first conductive layer may be etched to form capping patterns 170, second conductive patterns 162, and first conductive patterns 161. A portion of each first conductive pattern 161 may extend into the corresponding one of the trenches 120, and other portion of each first conductive pattern 161 may protrude upward from the corresponding one of the trenches 120. An exposed portion of the gate dielectric (e.g., 150 of FIGS. 6A through 6C) which is not covered with the first conductive patterns 161 may be removed during the etching process. Accordingly, gate dielectric patterns 151 may be formed between the first conductive patterns 161 and the active regions 105 and/or between the first conductive patterns 161 and the device isolation layer 101. Each of the gate electrodes 200 may include the first and second conductive patterns 161 and 162.

According to an exemplary embodiment of the inventive concept, as described with reference to FIGS. 2A through 2D, the gate dielectric 150 may be formed on the substrate 100 provided with the sacrificial layer 130, and thus, the sacrificial layer 130 may serve to prevent a portion of the fin portions F from being oxidized during the formation of the gate dielectric 150. Accordingly, the fin portions F may have the same width (e.g., W1), before and after the formation of the gate dielectric 150. For example, because the sacrificial layer 130 is oxidized without consuming silicon in the fin portions F, the fin portions F may have substantially the same width after the formation of the gate electrode 200. The channel width may be increased without increasing the fin portions F in size. The large channel width may result in a reduction in electric resistance of a channel region, such that the semiconductor device may have an increased cell current. Further, since the fin portions F are prevented from being oxidized, surfaces of the fin portions F may be maintained to be in the initial patterned state, and thus, a GIDL and a junction leakage may be suppressed or reduced.

FIGS. 9A through 13A are plan views illustrating a method of fabricating a semiconductor device according to an exemplary embodiment of the inventive concept. FIGS. 9B through 13B are cross-sectional views taken along line I-I' of FIGS. 9A through 13A, respectively, and FIGS. 9C through 13C are cross-sectional views taken along line II-IF of FIGS. 9A through 13A, respectively. An element previously described with reference to FIGS. 1 and 3A through 7C identified by a similar or identical reference number might not have its description repeated.

Figure 9A:
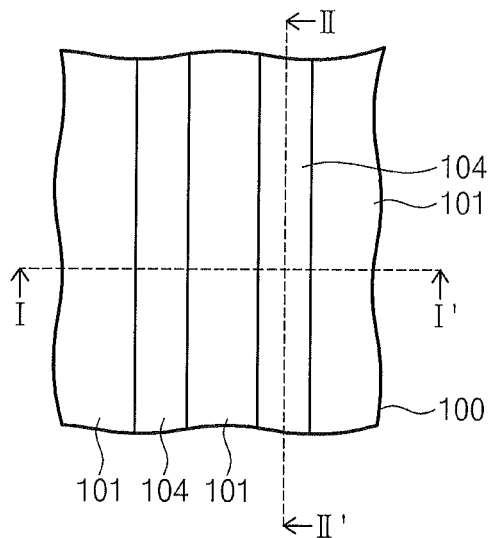
Figures 9B, 9C:
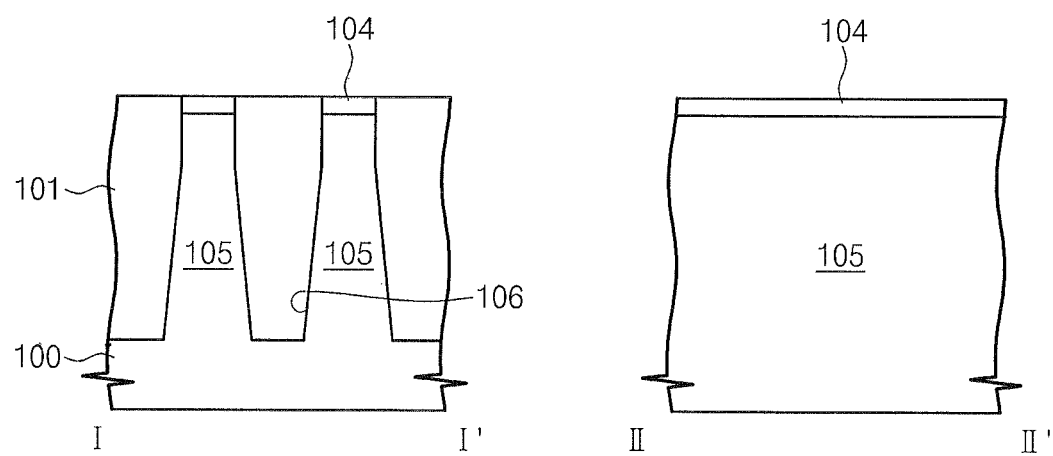
Figure 10A:
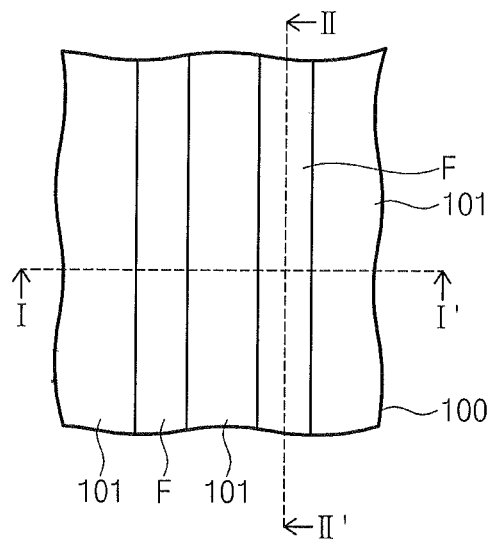
Figures 10B, 10C:
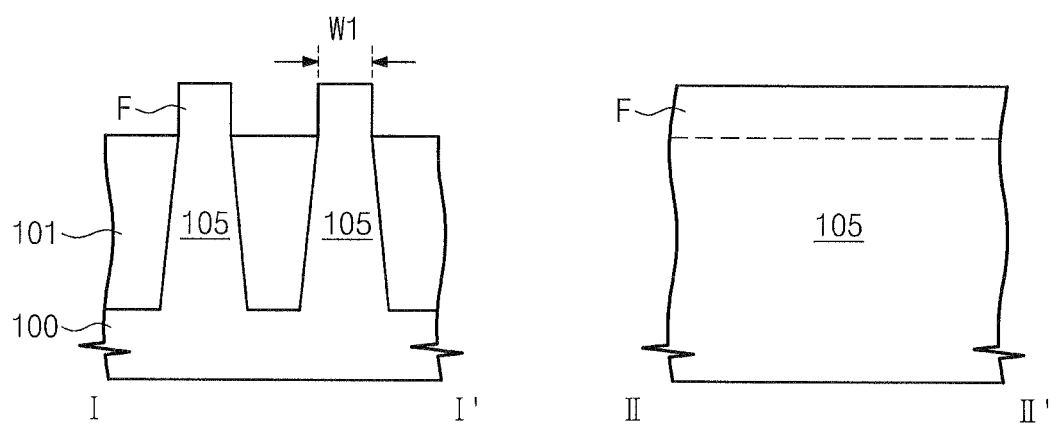
Figure 11A:
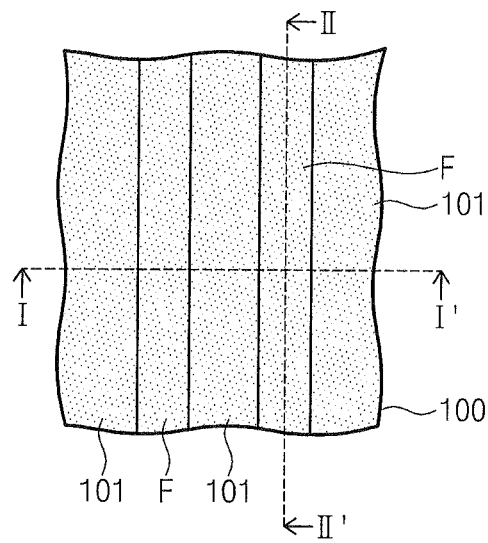
Figures 11B, 11C:
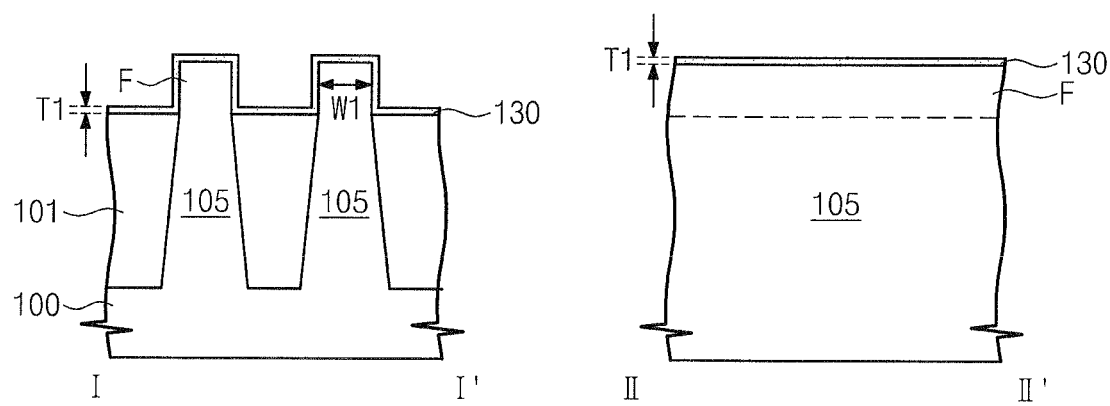
Figure 12A:
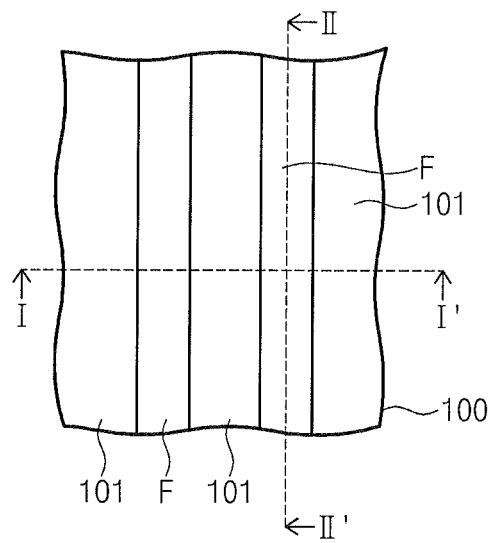
Figure 12B:
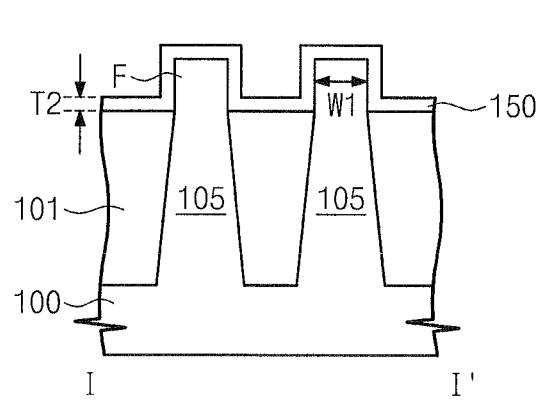
Figure 12C:
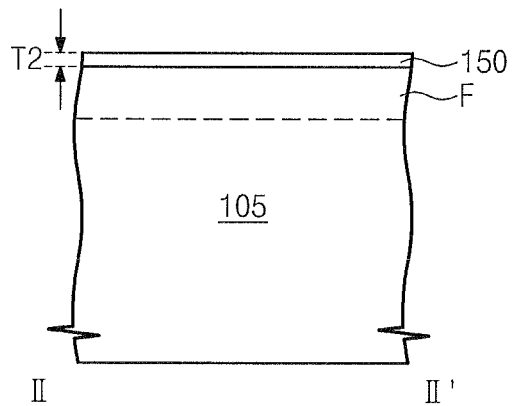

Referring to FIGS. 9A through 9C, a device isolation layer 101 may be formed on a substrate 100 to define active regions 105. For example, the formation of the device isolation layer 101 may include forming mask patterns 104 on the substrate 100 and etching the substrate 100 using the mask patterns 104 as an etch mask to form device isolation trenches 106. Each of the device isolation trenches 106 may be formed to be tapered downward. Thereafter, an insulating layer may be formed to fill the device isolation trenches 106 and be planarized to form the device isolation layer 101 defining the active regions 105. As the result of the planarization process, top surfaces of the mask patterns 104 may be exposed.

Referring to FIGS. 1, and 10A through 10C, fin portions F may be formed to protrude from the substrate 100 (in step S10). For example, the formation of the fin portions F may include etching an upper portion of the device isolation layer 101 to expose upper regions (the "fin portions F") of the active regions 105. The etching process may be performed using an etching recipe with etch selectivity with respect to the active regions 105. During the etching process, the mask patterns 104 may be removed to expose top surfaces of the fin portions F. The fin portions F may be formed to have a first width W1.

Referring to FIGS. 1, and 11A through 11C, a sacrificial layer 130 may be formed on the substrate 100 provided with the fin portions F (in step S20). The sacrificial layer 130 may be formed to cover top and side surfaces of the fin portions F. The sacrificial layer 130 may include, for example, an amorphous silicon layer. The amorphous silicon layer may include a silicon layer doped with boron (B) or arsenic (As) atoms or an undoped silicon layer. In an exemplary embodiment, the sacrificial layer 130 may include one or more silicon layer. For example, the sacrificial layer 130 may be formed to have a multilayered structure including a doped silicon layer and an undoped silicon layer. The sacrificial layer 130 may be formed using, for example, an ALD process. The sacrificial layer 130 may be formed to have a first thickness T1. For example, the first thickness T1 may range from about 1 Å to about 50 Å. In an exemplary embodiment, a thermal treatment process may be further performed on the sacrificial layer 130. As the result of the thermal treatment process, the amorphous silicon layer in the sacrificial layer 130 may be converted into a crystalline silicon layer.

Referring to FIGS. 1, and 12A through 12C, a gate dielectric 150 may be formed on the substrate 100 (in step S30). First, a cleaning process may be performed on the substrate 100 provided with the sacrificial layer 130 or on the resulting structure shown in FIGS. 11A through 11C. Thereafter, the gate dielectric 150 may be formed using a thermal oxidation process, an ALD process, or a CVD process. In an exemplary embodiment, the gate dielectric 150 may include a silicon oxide layer. During the formation of the gate dielectric 150, silicon atoms in the sacrificial layer 130 may be reacted with oxygen atoms to form a silicon oxide layer constituting a portion of the gate dielectric 150. The gate dielectric 150 may be formed to have a second thickness T2 that is greater than the first thickness T1 of the sacrificial layer 130. As the result of the oxidation of the sacrificial layer 130, the width W1 of the fin portions F may be maintained to be the same as that before the formation of the gate dielectric 150.

Referring to FIGS. 1, and 13A through 13C, a gate electrode 200 may be formed on the substrate 100 provided with the gate dielectric 150 (in step S40). For example, the formation of the gate electrodes 200 may include sequentially stacking a first conductive layer, a second conductive layer, and a capping layer on the substrate 100 provided with the gate dielectric 150. In an exemplary embodiment, the first conductive layer may include a polysilicon layer, and the second conductive layer may include a metal silicide layer. The capping layer may include a silicon nitride layer, a silicon oxide layer, or a silicon oxynitride layer. Thereafter, the capping layer, the second conductive layer, and the first conductive layer may be etched to form a capping pattern 170, a second conductive pattern 162, and a first conductive pattern 161. During the etching process of the first conductive pattern 161, the gate dielectric 150 which is not covered with the first conductive pattern 161 may be removed to form a gate dielectric pattern 151. The gate electrode 200 may include the first and second conductive patterns 161 and 162.

Figure 13A:
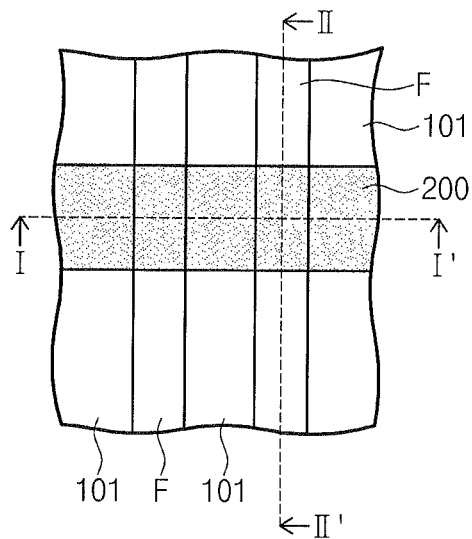
Figure 13B:
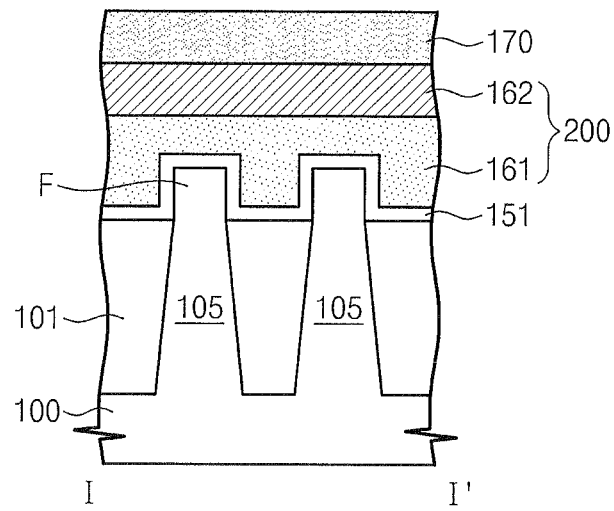
Figure 13C:
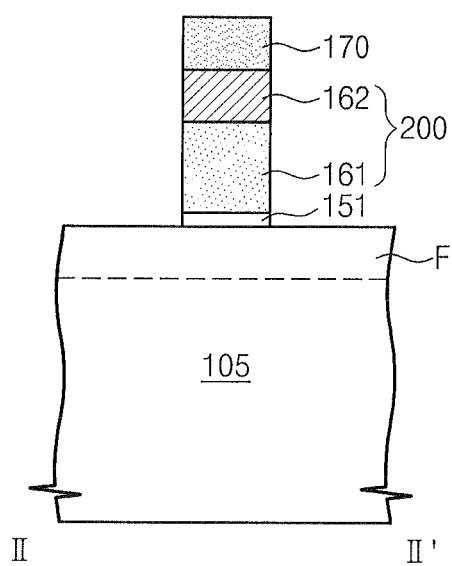

In the plan view of FIG. 13A, the gate electrode 200 may be formed to cross the fin portions F. Each gate electrode 200 may cross a plurality of fin portions F. In an exemplary embodiment, each gate electrode 200 may cross the corresponding one of the fin portions F. In an exemplary embodiment, each fin portion F may cross a plurality of the gate electrodes 200.

According to an exemplary embodiment of the inventive concept, as described with reference to FIGS. 2A through 2D, since the sacrificial layer 130 is oxidized to form a portion of the gate dielectric 150, to the sacrificial layer may prevent the fin portions F from being oxidized during the formation of the gate dielectric 150. For example, because the sacrificial layer 130 is oxidized without consuming silicon in the fin portions, the fin portions may have substantially the same width after the formation of the gate electrode. The channel width may be increased without increasing the fin portions F in size compared to the case where the sacrificial layer 130 is not used. The large channel width may result in a reduction in electric resistance of a channel region, such that the semiconductor device may have an increased amount of a cell current. Further, since the fin portions F are prevented from being oxidized, surfaces of the fin portions F may be maintained to be in the initial patterned state, and thus, a GIDL and a junction leakage may be suppressed or reduced.

Figure 14:
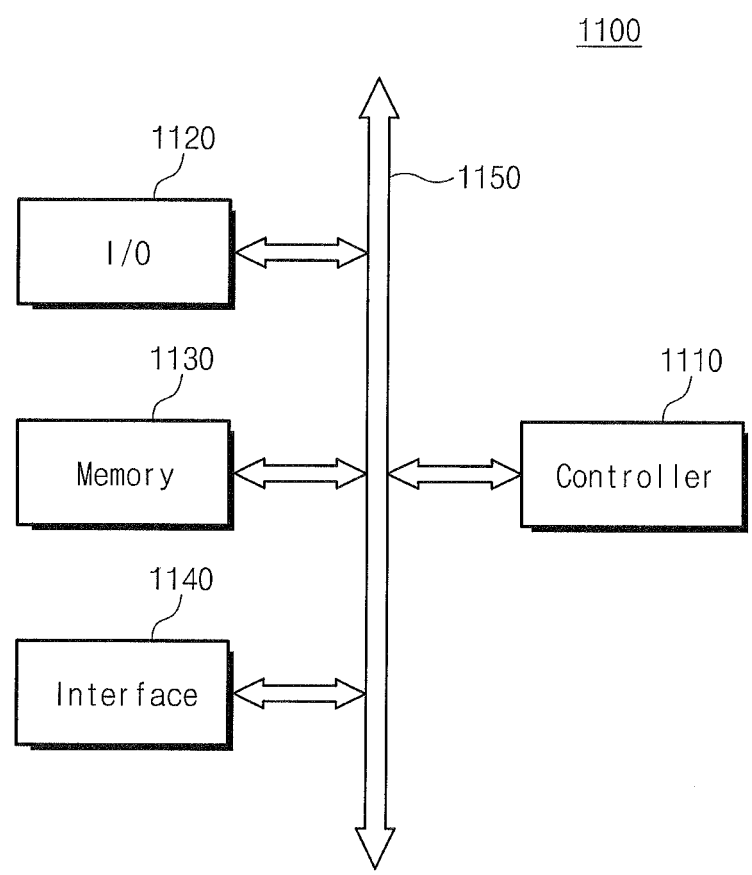
FIG. 14 is a block diagram illustrating an electronic system including a semiconductor device according to an exemplary embodiment of the inventive concept.

FIG. 14 is a block diagram illustrating an electronic system including a semiconductor device according to an exemplary embodiment of the inventive concept.

Referring to FIG. 14, an electronic system 1100 according to an exemplary embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other using the data bus 1150. The data bus 1150 may correspond to a signal path through which electrical signals are transmitted.

The controller 1110 may include a microprocessor, a digital signal processor, a microcontroller and/or another logic device. The other logic device may have a similar function to the microprocessor, the digital signal processor and/or the microcontroller. The I/O unit 1120 may include a keypad, a keyboard and/or a display unit. The memory device 1130 may store data and/or commands. The memory device 1130 may further include other types of data storing devices, which are different from the data storing devices described above. The interface unit 1140 may transmit electrical data to a communication network and/or may receive electrical data from a communication network. The interface unit 1140 may operate in a wireless and/or cable mode. For example, the interface unit 1140 may include an antenna for wireless communication and/or a transceiver for cable communication.

The electronic system 1100 may be applied to a laptop computer, a personal digital assistant (PDA), a portable computer, a web tablet, a wireless phone, a mobile phone, a digital music player, a memory card and/or other electronic products.

Figure 15:
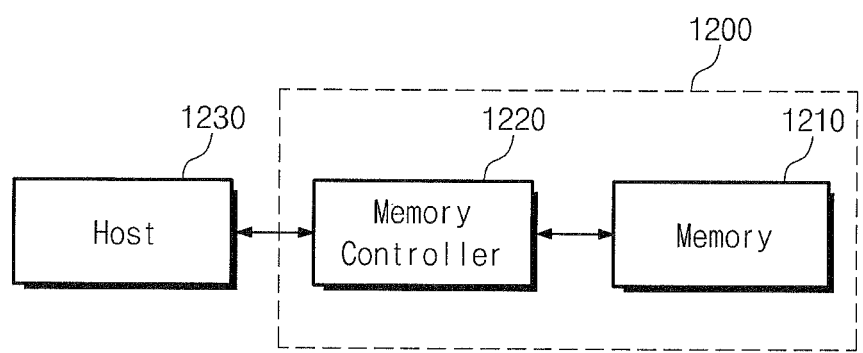
FIG. 15 is a block diagram illustrating a memory card including a semiconductor device according to an exemplary embodiment of the inventive concept.

FIG. 15 is a schematic block diagram illustrating a memory card including a semiconductor device according to an exemplary embodiment of the inventive concept.

Referring to FIG. 15, a memory card 1200 according to an exemplary embodiment of the inventive concept may include a memory device 1210. The memory device 1210 may include at least one semiconductor device according to an exemplary embodiment mentioned above. In an exemplary embodiment, the memory device 1210 may further include other types of semiconductor devices, which are different from a semiconductor device according to an exemplary embodiment described above. The memory card 1200 may include a memory controller 1220 that controls data communication between a host 1230 and the memory device 1210.

According to an exemplary embodiment of the inventive concept, a semiconductor device may have an increased cell current and/or reduced leakage current.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
    forming a device isolation layer on a substrate to define a plurality of active regions;
    forming a trench by patterning the plurality of active regions and the device isolation layer, the trench crossing the plurality of active regions and the device isolation layer disposed between two adjacent active regions and having an uneven bottom surface;
    forming a sacrificial layer on the uneven bottom surface of the trench; and
    forming a gate dielectric by oxidizing the sacrificial layer, the gate dielectric covering the uneven bottom surface of the trench,
    wherein the uneven bottom surface of the trench is constituted by the patterned device isolation layer and the patterned active regions protruded from the patterned device isolation layer.

2. The method of claim 1, wherein the sacrificial layer is a silicon layer.

3. The method of claim 2, wherein the sacrificial layer is formed to have a multilayered structure including a doped silicon layer and an undoped silicon layer.

4. The method of claim 1, wherein the sacrificial layer is formed using an atomic layer deposition process.

5. The method of claim 1, further comprising performing a thermal treatment process on the sacrificial layer.

6. The method of claim 1, wherein the gate dielectric is formed to have a thickness that is greater than that of the sacrificial layer.

7. The method of claim 1, further comprising performing a cleaning process on the sacrificial layer, before the forming of the gate dielectric.

8. The method of claim 1, further comprising forming a buried gate in the trench.

9. The method of claim 8, wherein the forming of the buried gate comprises:
- depositing a conductive layer on the gate dielectric; etching the conductive layer to form a plurality of conductive patterns;
- depositing a capping layer on the plurality of conductive patterns; and
- etching the capping layer to form a plurality of capping patterns disposed on the plurality of conductive patterns, respectively, wherein the plurality of capping patterns has a top surface that is substantially coplanar with that of the plurality of active regions.

10. The method of claim 1, further comprising forming a recess gate on the substrate, wherein the forming of the recess gate comprises:
- depositing a first conductive layer on the gate dielectric;
- depositing a second conductive layer on the first conductive layer;
- depositing a capping layer on the second conductive layer; and
- etching the capping layer, the second conductive layer, and the first conductive layer to form a plurality of capping patterns, a plurality of second conductive patterns, and a plurality of first conductive patterns,
- wherein each of the plurality of first conductive patterns comprises a portion extending into the trench and other portion protruding upward from the trench.

* * * * *